United States Patent [19]

Piedmont et al.

[11] 4,418,466

[45] Dec. 6, 1983

[54] METHOD OF MAKING A LINEAR LIGHT DETECTING DIODE INTEGRATED CIRCUIT

[75] Inventors: James R. Piedmont, Alexandria; Michael Hacskaylo, Falls Church, both of Va.

[73] Assignee: The United States of America as represented by the Secretary of the Army, Washington, D.C.

[21] Appl. No.: 258,168

[22] Filed: Apr. 27, 1981

[51] Int. Cl.³ .................................................. H01G 9/06
[52] U.S. Cl. ..................................... 29/572; 29/569 L; 29/574; 29/577 C; 29/591; 357/30; 357/51; 357/83; 338/195
[58] Field of Search ................... 29/572, 574, 577 C, 29/569 L, 589, 591; 357/30, 51, 83; 338/195

[56] References Cited

U.S. PATENT DOCUMENTS

| | | | |
|---|---|---|---|
| 3,609,992 | 10/1971 | Cacheux | 357/83 X |
| 3,760,181 | 9/1973 | Daly et al. | 250/332 |
| 4,097,988 | 7/1978 | Hauschild | 338/195 X |
| 4,228,418 | 10/1980 | Piedmont et al. | 338/195 |
| 4,283,774 | 8/1981 | Schwartz et al. | 338/195 X |
| 4,304,624 | 12/1981 | Carson et al. | 29/572 X |

Primary Examiner—L. Dewayne Rutledge
Assistant Examiner—Alan E. Schiavelli
Attorney, Agent, or Firm—Robert P. Gibson; Milton W. Lee; Aubrey J. Dunn

[57] ABSTRACT

An array for light detecting diodes is inserted into a cavity in an electrically insulating substrate with trimmable resistances on the substrate. The substrate is cooled, the diodes are connected to the resistances and are energized via electrical conductors on the substrate and in the cavity, and their individual near infrared light detectivities are measured. The resistors are trimmed by a laser beam such that all diodes have the same amount of detectivity. The substrate is allowed to return to ambient temperature, is mounted on a cold finger, and electrical conductors are made between the resistance-diode combinations and connectors on the cold finger.

2 Claims, 1 Drawing Figure

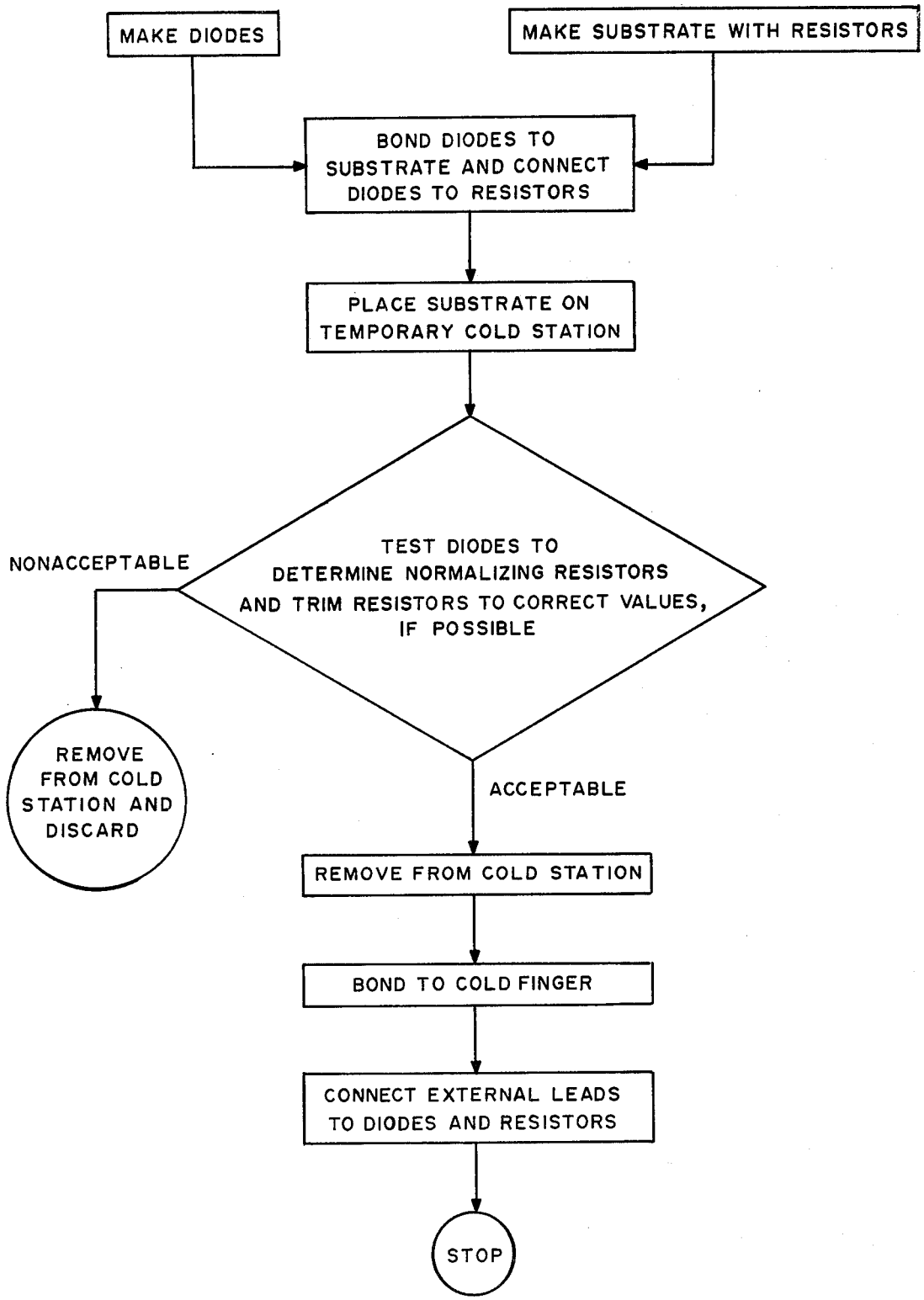

METHOD OF MAKING A LINEAR LIGHT-DETECTING DIODE INTEGRATED CIRCUIT

The invention described herein may be manufactured, used, and licensed by the U.S. Government for governmental purposes without the payment of any royalties thereon.

BACKGROUND OF THE INVENTION

This invention is in the field of linear light-detecting as well as light-emitting diode arrays and the methods by which such an array is integrated into a final device. A device so made is used in a forward looking infrared (FLIR) imaging viewer. An example of a FLIR view is shown in U.S. Pat. No. 3,760,181 of Sept. 18, 1973. For diodes operating in the range of 600-900 nm in the near infrared spectrum, it is necessary to cool the diodes to cryogenic temperatures. Arrays of diodes normally have individual differences in detectivity for a given input voltage. It is thus necessary to provide means to normalize the detectivity of the diodes for a uniform light-detecting response to uniform illumination on the diodes. This is usually done by providing individual resistors in series with the diodes. The methods by which the diode arrays for such FLIR systems are made involve the following major steps: make diode array, bond array to substrate, bond array substrate to cold finger, deposit conductors for diodes, connect external leads to cold finger, cool the cold finger, energize diodes and check individual diodes for detectivity and calculate required individual resistors, trim resistors on separate station, solder or glue resistors in electrical lead paths, cool the cold finger, energize diodes again and recheck, and remove the resistors if necessary and install new resistors. The steps including removing and installing resistors may be iterated until the device is acceptable or until it is decided that the array-cold finger device is totally unacceptable and is disgarded. This method of making the device is very expensive for two good reasons: the resistors are installed and removed by costly hand labor; unacceptable devices require many steps and much time and material compared to the method of the instant invention.

SUMMARY OF THE INVENTION

This invention is a method of making a linear light-detecting and/or light-emitting diode array integrated circuit. This circuit includes a substrate with electrical leads; the substrate has a linear array of light-detecting diodes in a cavity in the substrate, normalizing resistors on the substrate, and electrical leads between the diodes and resistors. The inventive method includes steps for depositing the resistors directly onto the substrate and laser trimming them while the substrate is mounted on a temporary cold station.

BRIEF DESCRIPTION OF THE DRAWING

The single drawing FIGURE is a flow chart for the inventive method.

DESCRIPTION OF PREFERRED EMBODIMENT

The invention may be best understood when this description is taken in conjunction with the drawing. The first step in the method is making the linear array of diodes; this may be done by any one of the known methods and may include the steps of preparing a semiconductor chip and doping said chip as required. The preferred diode material is HgCdTe. At the same time that the diodes are being made, a substrate is being prepared to receive the diodes. This substrate is a silicon chip with a cavity formed therein (as by etching) to receive the diodes. The cavity is metalized inside to provide a common electrical connection for the diodes, and normalization resistors are deposited on the surface of the chip. The diodes are then inserted into the cavity of the substrate chip and electrical connectors are deposited between diodes and respective resistors. The substrate with diodes and resistors is then temporarily attached (diodes and resistors exposed) onto a temporary cold station. This finger is cooled in the usual manner (cryogenic cooler) and electrical power is applied to the diodes whereby they detect near infrared light. The light detected by each individual diode is measured by a corresponding detector element and, in accordance with the individual detectivity, the resistor or resistors connected to each diode is laser trimmed (if needed) to provide uniform detectivity for all the diodes. If a predetermined number of diodes have detectivities outside some predetermined range the array is unacceptable and the substrate is removed from the temporary cold finger and discarded. If the array is acceptable, the substrate is removed from the cold station (after the resistors have been trimmed) and bonded to a cold finger. This cold finger will have a cavity therein to accept the substrate; electrical conductors are deposited on the cold finger to provide external leads from the diodes and resistors. The integrated circuit is thus complete and is ready for insertion into the equipment in which it is to be used.

Although the method just described seems to be a relatively few number of simple steps, it should be understood that each of the steps is merely a major step encompassing several or many smaller steps. For example, when testing the detectivity of the diodes to determine normalization resistances, the detectivities may be measured simultaneously with a predetermined voltage applied to all diodes or the diodes may be energized sequentially. In any event, the diode with lowest detectivity determines the value to which the other diodes must be normalized by their respective resistances. Each resistance may be merely a bar, and one may cut slices from the sides of the bar to increase its resistance, or each resistance may be in the form of a network of resistance elements, such as shown in U.S. Pat. No. 4,228,418. This patent, by the same inventors as the instant invention, shows an array of resistance elements whereby the end-to-end resistance may be varied by laser slicing various electrical conductors in the array. In either case of resistors, the detectivity of each diode may be continuously monitored as the resistor(s) for that diode is trimmed. Moreover, the steps of deposition of electrical conductors may take place in a vacuum or controlled atmosphere with the proper masking and evaporation of conductive material. In the case of the cold finger, the entire finger may be coated with a conductive material and a laser beam may be used to evaporate the material for delineation of individual leads. Also, the external leads on the cold finger may be deposited prior to insertion of the substrate.

While the above description has been directed to a light-detecting array, obviously a light-emitting array could be made by substantially the same steps. I.e., instead of applying power for testing and resistor trimming, one would omit the light and monitor the outputs of the (LED) diodes.

We claim:

1. The method of making a linear light-detecting diode array integrated circuit, including at least the steps of:

(a) preparing a linear array of diodes;

(b) preparing a substrate with resistors thereon corresponding to said diodes;

(c) mounting said array on said substrate and electrically connecting said resistors to corresponding diodes;

(d) placing said substrate on a temporary cold station;

(e) testing the light detectivity of said diodes to determine normalization resistance values therefor, and trimming corresponding resistances to such values;

(f) removing said substrate from said cold station;

(g) bonding said substrate to a cold finger; and (h) connecting external leads on said substrate and said cold finger.

2. The method as set forth in claim 1 wherein step (b) includes the steps of:

(1) forming a cavity in said substrate of physical dimension equal to those of the diode array;

(2) depositing resistors onto said substrate corresponding to said diodes; and (3) depositing an electrical conductor on the walls and bottom of said cavity.

* * * * *